(12) United States Patent
Kono et al.

(10) Patent No.: US 7,422,338 B2
(45) Date of Patent: Sep. 9, 2008

(54) LIGHT EMITTING DEVICE

(75) Inventors: Hiroshi Kono, Tokushima (JP); Masashi Ishida, Anan (JP); Saiki Yamamoto, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 11/709,756

(22) Filed: Feb. 23, 2007

(65) Prior Publication Data

US 2007/0247841 A1    Oct. 25, 2007

(30) Foreign Application Priority Data

Apr. 21, 2006   (JP)   .............. 2006-118360
Jul. 28, 2006   (JP)   .............. 2006-205499

(51) Int. Cl.
*G01D 11/28*   (2006.01)
*H01L 33/00*   (2006.01)

(52) U.S. Cl. .................. 362/27; 362/249; 362/800; 257/99

(58) Field of Classification Search .............. 362/27, 362/249, 800; 438/26; 257/99
See application file for complete search history.

(56) References Cited

U.S. PATENT DOCUMENTS 5,769,521 A    6/1998   Osawa et al.
6,531,328 B1 *  3/2003   Chen .................. 438/26
2005/0286299 A1  12/2005  Tomita et al.

FOREIGN PATENT DOCUMENTS

JP   H09-298263 A   11/1997
JP   2006-24345 A   1/2006

* cited by examiner

*Primary Examiner*—John A Ward
(74) *Attorney, Agent, or Firm*—Global IP Counselors, LLP

(57) ABSTRACT

A light emitting device comprises: a light emitting element; a plurality of lead frames to which the light emitting element is electrically connected; and a package that includes in its interior at least part of said lead frames which protrude outward at one end, that is equipped with an opening for taking off light from the light emitting element, and that extends in the lengthwise direction, wherein a concave portion is formed in the outer surface of at least part of the package wall, the lead frames protruding outward from the package are accommodated in this concave portion, and the walls that constitute said opening and are across from each other in the widthwise direction of the package comprise at least a first wall that is across from the light emitting element, a second wall that is raised up by a step from the first wall, and a third wall that links the first wall and the second wall, and the second wall and third wall are formed thicker than the first wall.

10 Claims, 4 Drawing Sheets

LIGHT EMITTING DEVICE

BACKGROUND OF THE INVENTION

1. Field of the Invention

The present invention relates to a light emitting device, and more particularly relates to a surface mount type of light emitting device that is compact and lightweight.

2. Background Information

Light emitting devices that are compact, have good sensitivity, and have light emitting elements with high brightness and high output have been developed and put to use in various fields in recent years. Because of their compact size, low power consumption, light weight, and other advantages, such light emitting devices have been used, for example, for light sources in portable telephones and liquid crystal backlights, as light sources for various kinds of meter, and as various kinds of read-out sensor.

A light source used for a backlight, for example, needs to have a thin construction so that the device in which it is used can be made more compact and lightweight. Therefore, the light emitting device used as the light source must itself be compact in size, and to this end a variety of light emitting devices have been developed in a configuration called a side view type (for example, JP-2006-24345-A).

A side view type is generally configured such that an opening for releasing light is formed in a side face of a package, a light emitting diode chip is mounted on the bottom face of the package, and part of a lead frame is taken as an external terminal from the inside of the package to the outside.

Reductions in the size of side view light emitting devices have mainly been in the form of height reductions, and therefore methods for strengthening a thinner package have been studied as the packages themselves have been becoming thinner (for example, JP-H09-298263-A).

However, if the package itself is made thinner, the low strength of the package may cause it to bend or chip, and this lowers the yield.

Also, a package is formed by performing injection molding, compression molding, or the like, but a phenomenon called a short shot can occur in which the molding material does not reach all the way into the corners of the mold cavity and the cavity is not completely filled.

SUMMARY OF THE INVENTION

The present invention was conceived in an effort to solve these problems, and it is an object thereof to provide a light emitting device with which adequate package strength can be ensured, handling and yield are improved, the thinner and more compact size desired in the past can be achieved by utilizing the space inside the light emitting device more efficiently, and the mounting space accounted for by the device can be kept to a minimum.

According to an aspect of the present invention, there is provided a light emitting device, comprising:

a light emitting element;

a plurality of lead frames to which the light emitting element is electrically connected; and a package that includes in its interior at least part of said lead frames which protrude outward at one end, that is equipped with an opening for taking off light from the light emitting element, and that extends in the lengthwise direction, wherein a concave portion is formed in the outer surface of at least part of the package wall, the lead frames protruding outward from the package are accommodated in this concave portion, and the walls that constitute said opening and are across from each other in the widthwise direction of the package comprise at least a first wall that is across from the light emitting element, a second wall that is raised up by a step from the first wall, and a third wall that links the first wall and the second wall, and the second wall and third wall are formed thicker than the first wall.

With the light emitting device of the present invention, the chipping and bending of a package due to low package strength are prevented, and deformation caused by thermal expansion is also prevented, which ensures good mechanical strength and improves handling and yield. Also, the thinner and more compact size desired in the past can be achieved by utilizing the space inside the light emitting device more efficiently, and the mounting space accounted for by the device can be kept to a minimum.

Furthermore, even when a package is produced by a conventional method such as injection molding or compression molding, for example, the occurrence of "short shot" can be prevented, and the package material can be prevented from leaking out from the lead frame portions, which makes manufacture easier and allows a light emitting device of higher quality to be obtained.

DETAILED DESCRIPTION OF THE PREFERRED EMBODIMENTS

Figure 1:
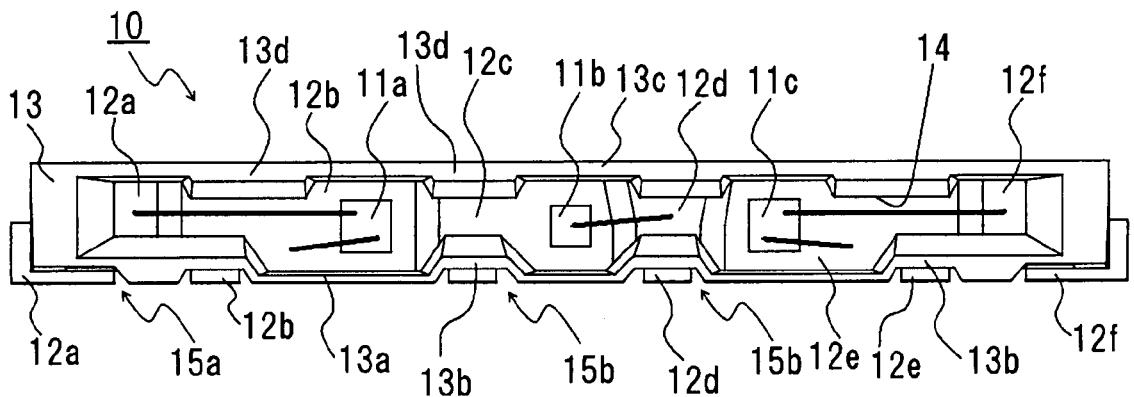
FIG. 1 is a simplified plan view of the main components in the light emitting device of the present invention.

As shown in FIG. 1, for example, the light emitting device of the present invention mainly comprises light emitting elements 11a, 11b, and 11c, lead frames 12a to 12f, one end of which functions as a lead terminal, and a package 13.

Light Emitting Elements

The light emitting elements are generally semiconductor light emitting elements, especially, any semiconductor light emitting elements may be used so long as they are elements called light emitting diodes. For example, it includes a laminated structure that contains an active layer above a substrate, which is made of nitride semiconductors such as InN, AlN, GaN, InGaN, AlGaN, and InGaAlN, and compound semiconductors of a group III-V elements, II-VI elements, and the like. The structures of semiconductor includes homostructures having MIS junctions, PIN junctions, or PN junctions or the like, heterostructures, and double heterostructures. Furthermore, a multilayer laminate structure or an ultra lattice structure are also acceptable, as are a single quantum well structure or a multiquantum well structure laminated as a thin film which generates quantum effects. The active layer may contain a donor impurity such as Si, Ge, or the like, and acceptor impurity such as An, Mg, or the like. A wave length of the obtained light emitting element may be changed from ultraviolet to red region depending on a material of the semiconductor, a mixed crystal rate, In content of the active layer, kind of the impurity doped in the active layer.

The light emitting elements are mounted on the lead frames (discussed below), and a joining material is used for this purpose. For instance, in the case of light emitting elements formed by growing a nitride semiconductor on a sapphire substrate, that emit blue and green light, an epoxy resin, silicone, or the like can be used. When degradation due to light or heat from the light emitting elements is taken into account, the back side of the light emitting elements may be plated with aluminum, or instead of using a resin, a solder such as eutectic Au—Sn, or a brazing material such as a low-melting point metal may be used. In the case of a light emitting element with electrodes formed on both sides, such as a light emitting element that is formed by GaAs, or the like and emits red light, die bonding may be performed using a conductive paste made of silver, gold, palladium, or the like.

The light emitting device of the present invention may comprise just one light emitting element, or a plurality of them may be mounted. In the latter case, a plurality of light emitting elements that emit light of the same color may be combined. Color reproduction can be enhanced by combining a plurality of light emitting elements that emit light of different colors, so as to handle RBG, for instance. Also, luminosity can be increased by combining a plurality of light emitting elements of the same emission color.

Lead Frames

The lead frames are electrodes used for electrically connecting to the light emitting elements, and may be substantially flat, or may be undulating, or may be in the form of a bumpy sheet. There are no particular restrictions on the material, but forming the lead frames from a material with a relatively high thermal conductivity is preferable. Forming from such a material allows the heat generated by the light emitting elements to escape more efficiently. For example, it is preferable to use a material that has a thermal conductivity of about 200 W/(m·K) or higher, or one with a relatively high mechanical strength, or one that lends itself well to punching, etching, or other such working. More specifically, examples include copper, aluminum, gold, silver, tungsten, iron, nickel, and other such metals, and alloys such as iron-nickel or phosphor bronze. Also, the surface of the lead frames is preferably given a reflective plating so that the light from the mounted light emitting elements can be taken off more efficiently. The size, thickness, shape, and so forth of the lead frames can be suitably adjusted after taking into account the size, shape, and so forth of the light emitting device to be obtained. Also, since lead frames are usually worked by bending on the outside of the package, it is preferable if burrs and the like are moved from the portions of the lead frames that will come into contact with the side walls of the package, or from portions near the package, and if these edge portions are rounded. This allows the lead terminals to be worked as desired, without sacrificing the shape of the package.

Each lead frame has a region in which a light emitting element is disposed inside the package (discussed below) and/or a region that is disposed inside the package and that is electrically connected to a light emitting element, and a region that protrudes from one face or side of the package and functions as a lead terminal.

Usually, two or more lead frames are provided to a single light emitting device, and it is good for their to be one more lead frame than there are light emitting elements, or for there to be at least twice as many lead frames as light emitting elements. For instance, if just one light emitting element is used, the light emitting element is mounted on one of the lead frames, an electrical connection is made with one of the electrodes of the light emitting element, and the other lead frame is electrically connected with the other electrode of the light emitting element.

When two or more light emitting elements are used, some or all of the light emitting elements may be mounted on a single lead frame and electrically connected, and other lead frames may be electrically connected to each of the light emitting elements. For example, each light emitting element may be mounted on and electrically connected to a separate lead frame, and other lead frames may be electrically connected to each of the light emitting elements. More specifically, when three light emitting elements are used that correspond to RGB, and the RGB elements are independently driven, one common terminal and three independent terminals can be provided. Thus mounting a plurality of light emitting elements and using independent wiring so that one lead frame is electrically connected to each of these makes it possible to select from among various wiring patterns, such as serial or parallel, and affords greater design freedom in the mounting of the light emitting device. Also, when independent wiring is used, it is easier to adjust the emission intensity of the mounted light emitting elements, so this is particularly advantageous when using a plurality of light emitting elements that emit light of different colors, such as a full-color LED. In addition, the heat dissipation paths of the various light emitting elements can be formed without overlapping, so the heat generated from the light emitting elements can be dissipated more evenly, resulting in better heat radiation.

There are no particular restrictions on the material, shape, size, thickness, and so forth of the lead frames, but they must be made of a material that allows the proper amount of electrical power to be supplied to the light emitting elements.

The other end of a lead frame may also be made to protrude from a package portion (such as the opposite side) that is different from the face or side where part of the lead frame protrudes. This lead frame may be one that is not electrically connected to a light emitting element and on which no light emitting element is mounted, or a light emitting element may just be mounted without being electrically connected. The other end of the lead frame preferably has a larger surface area than the portion that functions as a lead terminal. This allows this end to function as a heat dissipation path for guiding the heat produced by the light emitting element in the package to the outside, or as a means for dealing with over-voltage.

There are no particular restrictions on the size and shape of the lead terminal and the other end of the lead frames, and as long as these extend outside the package (discussed below), for example, they can be suitably adjusted according to the heat dissipating capability of the light emitting elements mounted in the light emitting device and the mode in which the light emitting device will be used (installation space, installation location, etc.). Also, the other end and the lead terminal can be suitably bent or deformed according to the usage mode, such as the positional relationship with other electronic devices. However, it is good if the lead frame protruding beyond the package is accommodated in a concave portion formed in the surface of the package wall (discussed below). In this case, it is preferable if all or part of the lead frame is accommodated in the concave portion, as discussed below.

Package

The package may be formed of any material as long as the package protects the light emitting elements and is formed integrally with the lead frames, and insulation of the light emitting elements and the lead frames can be ensured. For instance, thermoplastic resins, thermosetting resins, and so forth can be used, specific examples of which include polyphthalamide (PPA), polycarbonate resin, polyphenylene sulfide (PPS), liquid crystal polymer (LCP), ABS resin, epoxy resin, phenol resin, acrylic resin, PBT resin, and other such resins, and ceramics. Various kinds of dye, pigment, or the like may also be mixed into these materials as colorants or light diffusers. This makes it possible to keep the amount of emitted light absorbed by the package to a minimum, or to obtain a white package with high reflectivity. Examples of colorants include $Cr_2O_3$, $MnO_2$, $Fe_2O_3$, and carbon black, and examples of light diffusers include calcium carbonate, aluminum oxide, and titanium oxide. The package usually has an opening (discussed below) that is filled with a translucent covering material, so it is preferable to select materials with little different in their coefficients of thermal expansion, taking into account factors such as adhesion between the translucent covering material and the package that has been subjected to the effects of heat produced from the light emitting elements and so forth.

There are no particular restrictions on the size and shape of the package, and the external shape in plan view may, for example, be circular, elliptical, triangular, quadrangular, polygonal, or some other shape that is close to these. Of these, a shape that is extended in the lengthwise direction is preferable.

However, an opening for mounting the light emitting elements is formed in the surface of the package. There are no particular restrictions on the shape of this opening, and as long as it allows the light emitting elements to be mounted and part of the surface of the lead frames that are to be electrically connected to be exposed within the opening, or on the bottom face of the opening, the shape may be a circular, elliptical, triangular, quadrangular, or polygonal column, or may be dome-shaped, arm-shaped, etc., or a shape that is close to these. This allows light from the light emitting elements to be reflected by the walls inside the package, and to be taken off more efficiently in the front direction. The size, depth, and so forth of the opening can be suitably determined according to the number of light emitting elements to be mounted, the bonding method, and so on. Subjecting the bottom face and/or side faces of this opening to embossing, plasma treatment, or the like increases the adhesion surface area and improves adhesion with the translucent covering member (discussed below).

A concave portion is formed in the outer surface of at least the part of the package wall in which the opening is located. The concave portion here preferably drops down to the inner surface of the package wall and is formed so that a convex portion is formed on the inner surface. This concave portion allows the space inside the light emitting device (such as dead space) to be utilized more effectively, and this affords a more compact light emitting device.

Figure 2:
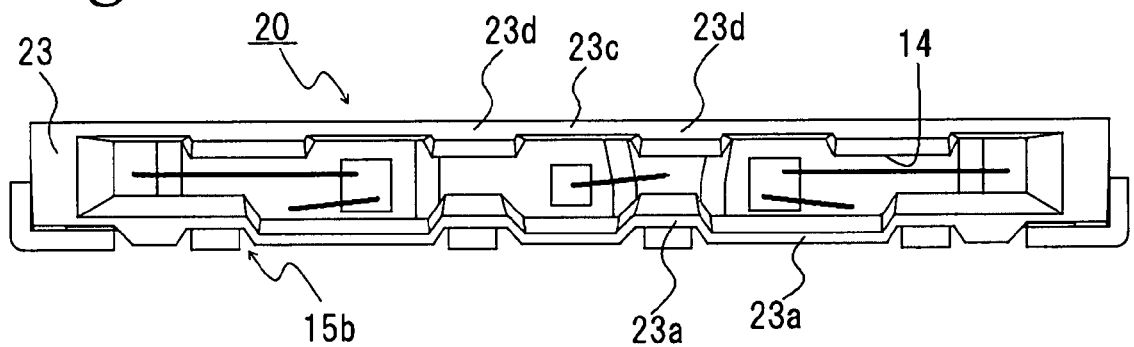
FIG. 2 is a simplified plan view of the main components in another light emitting device of the present invention.
Figure 3:
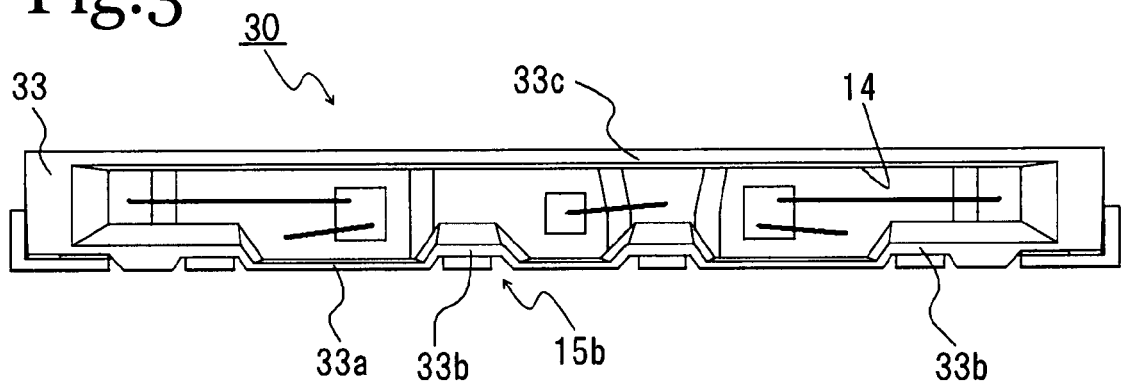
FIG. 3 is a simplified plan view of the main components in yet another light emitting device of the present invention.
Figure 4:
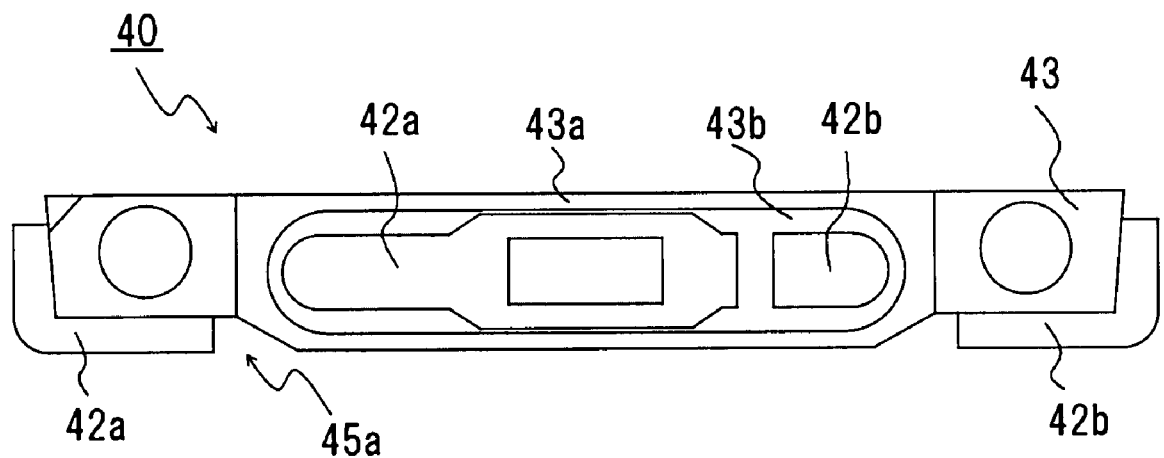
FIG. 4 is a simplified plan view of the main components in yet another light emitting device of the present invention.
Figure 5:
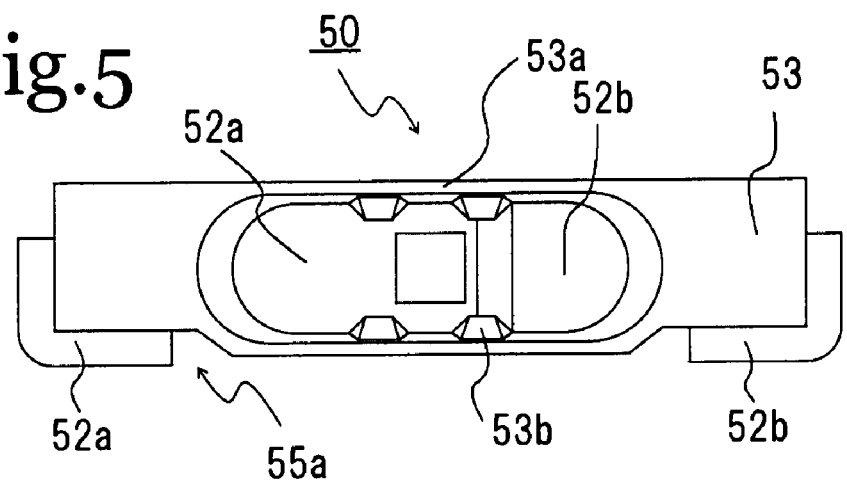
FIG. 5 is a simplified plan view of the main components in yet another light emitting device of the present invention.

There are no particular restrictions on the size and shape of the concave portion, but it should ensure a space large enough for the part of the lead frame protruding outward from the package to be, accommodated in this concave portion. Preferably, it is large enough that to accommodate the part of the lead frame protruding outward from the package and for part of the surface to be in the same plane as the outer surface of the package wall. "In the same plane" here means that the lead terminal and a circuit board or other such mounting substrate are in electrical contact merely by placement on the circuit board, and the concave portion is flat enough to allow stable fixing. Alternatively, this means that a portion in which there is substantially no height difference is present between the outer surface of the package wall and part of the surface of the lead frame. The height difference need not be strictly zero, however, and about ±2 mm is permissible. What is referred to by "part of the lead frame is accommodated in this concave portion" is not only that the lead frame is disposed within a complete concave portion 15b as shown in FIGS. 1 to 3, but also that concave portions 45a and 55a that are cut off at the corners of the package are formed as shown in FIGS. 4 and 5, and part of the lead frames are disposed in these concave portions 45a and 55a at the corners.

Figure 7A:
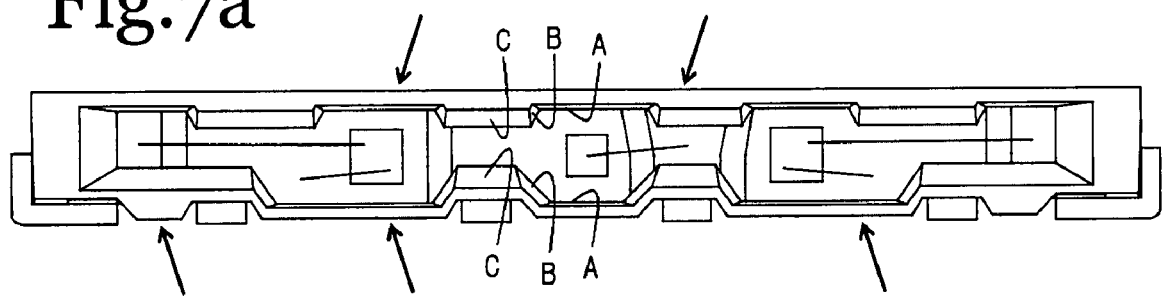
FIG. 7a to 7c are simplified plan views of the main components in several light emitting devices of the present invention.
Figure 7B:
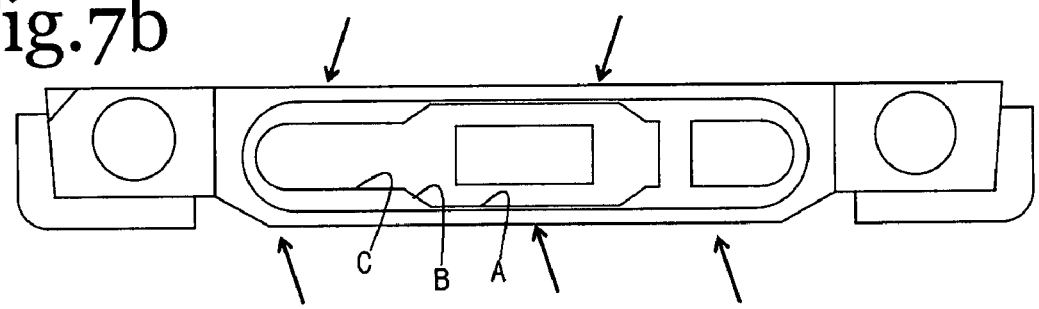
Figure 7C:
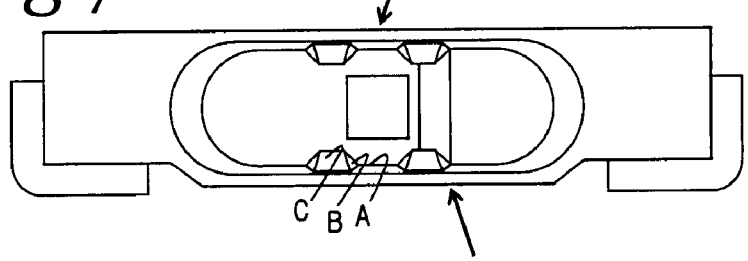

As shown in FIG. 7, the package is preferably such that the package walls constituting the opening (the walls across from each other in the widthwise direction, pointed by arrows) are equipped with first walls A across from the light emitting element, second walls C that are raised up by a step from the first walls A, and third walls B that link the first walls A and the second walls C. The first wall A is the thinnest wall, formed around the periphery of the light emitting element, and the second wall C and third wall B are formed thicker than the first wall A.

The "step" referred to here means that there is a stepped height differences on the inner wall face of the package. For example, this height difference can be suitably adjusted according to the size of the light emitting device and the light emitting elements and other such factors, but an example is about 0.03 to 0.2 mm. This height difference is constituted by the first wall and second wall, and the first wall refers to the wall portion closest to the light emitting element. The third wall links the other two walls over this height difference step.

Alternatively, from another standpoint, it is preferable either for the third wall to be formed at a slope of at least 0.2, at least 0.25, at least 0.3, at least 0.35, at least 0.4, or at least 0.5, or for it to be linked to the first wall or second wall at an angle of 90° to 170°, 90° to 160°, 90° to 150°, or 90° to 148°. Furthermore, it is preferable for the thickness change at the angles in the above range to be a linear change. That is, the second wall is preferably formed by a plane. The first wall, which is the thinnest peripheral portion of the light emitting element, is favorably a plane, and in terms of ensuring a compact size for the light emitting device, it is favorable for this wall to be within a range up to about five times the width of the light emitting element, a range up to about four times, or a range up to about three times. The third wall is not necessarily constituted by a plane, but preferably includes a planar portion.

This minimizes the thin-film portion of the wall, that is, it ensures the maximum amount of space in just the peripheral portion around the light emitting element, while allowing the strength of the package as a whole to be increased.

The thicker portion (that is, the second wall and third wall of the package) is preferably the portion where the lead frame is disposed, or close thereto, but is not necessarily dependent on the location of the lead frame. For example, as shown by 53a in FIG. 5, it may be disposed in the vicinity of the peripheral part of the light emitting element. This allows the mechanical strength of the light emitting device itself to be increased even though the walls of the package are formed as thin films on the whole.

It is particularly favorably for the thicker portion to be at least part of the wall constituting the concave portion. Usually, in the manufacture of the package, the molten package material is allowed to flow in by a known method, such as injection molding or compression molding, through a gate formed at a site corresponding to the lower face of the package, in a metal mold closed off by inserting a lead frame (preferably more than one), and this material is cured so that the parts are integrally molded. With the wall constituting the concave portion, because the walls of the mold curve, short-shot tends to occur, in which the molding material does not reach all the way into the corners of the mold cavity and the cavity is not completely filled. However, short-shot can be effectively prevented by increasing the thickness, particularly in portions that curve, as in the present invention. Also, a translucent covering material is usually injected around the light emitting element in the opening to seal the light emitting element, but because of the poor adhesion between the lead frame and package materials, the translucent covering material may leak out from the interface between the lead frame and package materials, and may leak through the package material and out to the adjacent terminal. If electroconductive dirt should adhere to the resin that leaks out, it can cause leakage and other such problems during the use of the device. If the lead frame is sandwiched at the portion corresponding to the wall constituting the concave portion, the uneven shape will lengthen the distance between electrodes on the package material, and this prevents the resin from leaking out to the adjacent electrode.

There are no particular restrictions on how thick the thicker wall is, but about 150 to 200% of the thickness of the other, thinner portion (for example, the thinnest portion of the package; the first wall) is favorable. The thicker portions (the second wall and third wall) may have a consistent thickness all the way in the depth direction of the opening (the direction leading from the top of the opening to the bottom), or the thickness may vary. A tapered shape (with the top of the opening being wider than the bottom) is particularly favorable. There are no particular restrictions on the taper angle, but it may be about 0 to 45°, or about 10 to 30°, for example. This improves the light take-off efficiency. Also, with a tapered shape, if the taper angle of the thicker portion is smaller (if the slope is flatter) than that of the other portions of the package walls, then this portion can be made relatively thicker than the other portions of the package walls. As a result, the size of the light emitting device itself can be kept to a minimum, while it is possible to improve the strength of the package itself, the light take-off efficiency, and space utilization inside the light emitting device, all at the same time. If the thicker portions of the walls (the second wall and third wall) are formed thicker by means of a taper angle that is different from that of other portions (including the first wall), the boundary between the thicker portions and the thin-film portions will have the same thickness at a point in the opening height direction, but there will be a step difference overall. The thicker portions do not necessarily have to have a tapered shape with the same taper angle, and there may be a plurality of portions of different thickness in the overall package. For instance, the first wall, second wall, and third wall are favorably set to a taper angle of 0 to 45°. Also, the thicker portions may be formed thicker only in places by forming an uneven surface by embossing, texturing, or the like, or a plurality of thick film regions may be formed in the portion of the wall constituting the concave portion.

A protective element other than a light emitting element may also be mounted in the light emitting device of the present invention. There may be just one protective element, or there may be two or more. There are no particular restrictions on the protective element, and any known type that is mounted in light emitting devices may be used. Specific examples include elements that protect against overheating, over-voltage, over-current, and static electricity, and circuit protection elements.

With the light emitting device of the present invention, the opening in which the light emitting element is located is preferably filled with a translucent covering material. This translucent covering material protects the light emitting element from external force, moisture, and so forth, and also protects wires. Examples of this translucent covering material include epoxy resin, silicone, acrylic resin, urea resin, and other transparent resins, glass, and so forth with excellent weather resistance. In particular, even if moisture should be admixed into the translucent covering material during manufacture or storage, any moisture contained in the transparent resin can be released to the outside by baking for at least 14 hours at 100° C. Therefore, it is possible to prevent separation between the light emitting element and a molding member, and steam explosion.

The translucent covering material may contain a diffuser or a fluorescent substance. A diffuser is an agent that diffuses light, and serves to lessen directionality from the light emitting element and to widen the viewing angle. A fluorescent substance is one that converts light from the light emitting element, and is able to convert the wavelength of light emitted from the light emitting element to the outside of the package. If the light from the light emitting element is visible light with a short wavelength and high energy, then it is favorable to use an inorganic phosphorescent material such as ZnCdS:Cu, YAG:Ce, or nitrogen-containing $CaO$—$Al_2O_3$—$SiO_2$ that has been activated with europium and/or chromium, or a perylene derivative, which is an organic phosphorescent material. With the present invention, when white light is to be obtained, particularly when a YAG-Ce phosphorescent material is used, depending on the content thereof, it is possible to emit yellow light that absorbs part of, and is a complement to, the light from a blue light emitting element, and white light can be formed relatively simply and with good reliability. Similarly, when nitrogen-containing $CaO$—$Al_2O_3$—$SiO_2$ that has been activated with europium and/or chromium is used, depending on the content thereof, it is possible to emit red light that absorbs part of, and is a complement to, the light from a blue light emitting element, and white light can be formed relatively simply and with good reliability. Also, color unevenness can be reduced by completely precipitating the phosphorescent material and removing bubbles.

Examples of the light emitting device of the present invention will now be described in detail through reference to the drawings.

EXAMPLE 1

As shown in FIG. 1, the light emitting device 10 in this example comprises three light emitting elements 11a, 11b, and 11c corresponding to RGB, lead frames 12b, 12c, and 12e on which these light emitting elements are mounted and which are electrically connected by wires to one of the electrodes of the light emitting elements, three lead frames 12a, 12d, and 12f that are electrically connected by wires to the other electrode of these light emitting elements, and a package 13 that integrally fixes the lead frames 12a to 12f.

The lead frames 12a to 12f are formed as flat pieces composed of an iron alloy of copper. The lead frames 12a to 12f each comprise a region in which a light emitting element is located, or which is electrically connected to a light emitting element, and a portion that protrudes from this region to the outside of the package and functions as a lead terminal. The lead frames 12a to 12f functioning as lead terminals are portions on the exterior of the package that have been worked into a suitable shape, and particularly worked by bending, and the portion that hits the wall of the package, or is disposed near the package, is deburred and its edges are rounded. The surface of the lead frames 12a to 12f is plated with silver so that the light from the light emitting elements can be taken off more efficiently.

The package 13 has the lead frames 12a to 12f disposed on its bottom face, and is formed in an external shape that is close to being rectangular solid, with part of the lead frames 12a to 12f integrally fixed so as to protrude from the package. The package 13 has a substantially rectangular opening 14 formed near its center.

Parts of the lead frames 12a to 12f are exposed in a row at the bottom inside the opening 14, the three light emitting elements 11a, 11b, and 11c corresponding to RGB are provided in a row, and the lead frames 12a, 12c, and 12e are connected by wires to one of the electrodes of the light emitting elements as a cathode. The lead frames 12b, 12d, and 12f are connected by wires to the other electrode of the light emitting elements as a anode.

The side face of the wall of the package 13 varies in thickness from place to place. In FIG. 1, thin films 13a and 13c are formed on the wall of the package 13 in order to make the opening wider near the region where the light emitting elements 11a, 11b, and 11c are provided, and near the region electrically connected by wires, and thicker portions 13b and 13d are formed in the other regions. For example, the thinner portion 13a, at the bottom faces, is formed in a thickness of about 0.1 mm, the thinner portion 13c about 0.12 mm, the thicker portion 13b about 0.2 mm, and the thicker portion 13d about 0.22 mm. The taper amount of the thinner portion 13a, for example, is about 0.02 mm, the thinner portion 13c about 0.04 mm, the thicker portion 13b about 0.13 mm, and the thicker portion 13d about 0.1 mm. This ensures adequate strength in the package 13 while effectively utilizing the dead space in the interior, and thereby keeps the outer dimensions to a minimum. In particular, the portion near the lead frames 12a to 12f that protrude out from the package 13, that is the wall where the concave portions 15a and 15b are formed, is formed as a thicker portion 13b, so leakage of package material from near the lead frames during the manufacture of the package can be effectively prevented. The thicker portion 13b and the thinner portion 13a differ by an angle of 135°. Although not shown in the drawings, the side faces of the lead frames 12a to 12f are exposed on the outer surface of the package 13 in the portion where the thicker portion 13d is formed.

The concave portions 15a and 15b are formed on the side face of the package 13. This concave portion 15a is cut out from the corner in the side face, and the concave portion 15b is in the form of an approximate groove in the side face. In particular, the concave portion 15b in the side face drops down to the inner surface so as to form a convex portion toward the inside the opening 14 in the package 13. The size of the concave portions is favorably such that the width is about 0.3 to 0.5 mm when the lengthwise direction of the package 13 is about 7.0 mm. This allows the lead frames 12a to 12f protruding from the package 13 to be accommodated in the concave portions 15a and 15b so that the outer surface of the lead frames 12a to 12f is in the same plane as part of the surface of the package 13.

Although not shown in the drawings, the light emitting device 10 has protective elements that are electrically connected to the lead frames 12a and 12b inside the package 13.

This light emitting device can have enough mechanical strength while taking up the minimum amount of space, and can be easily mounted on a circuit board. Furthermore the space required for mounting on a circuit board can be kept to a minimum, which affords greater latitude in combining it with other electronic devices. In addition, other electronic devices can be disposed closer to the light emitting device, so the size and weight of a device can be reduced while the output is raised.

Furthermore, because three light emitting elements are provided, good color reproducibility can be ensured, and since the three light emitting element are independently controlled by lead frames, the emission intensity can be adjusted.

EXAMPLE 2

As shown in FIG. 2, the light emitting device 20 in this example is constituted substantially the same as the light emitting device in Example 1, except that near the concave portion 15b corresponding to the portion where the lead frames 12a to 12f protrude, the wall 23a of the package 23 is formed in a constant thickness and so that the taper angle is also substantially the same, and the thicker portion 23d and the thinner portion 23c are formed only on the side from which the lead frames 12a to 12f do not protrude.

This light emitting device can have enough mechanical strength while taking up the minimum amount of space, and can be easily mounted on a circuit board. Furthermore the space required for mounting on a circuit board can be kept to a minimum, which affords greater latitude in combining it with other electronic devices. In addition, other electronic devices can be disposed closer to the light emitting device, so the size and weight of a device can be reduced while the output is raised.

EXAMPLE 3

As shown in FIG. 3, the light emitting device 30 in this example is constituted substantially the same as the light emitting device in Example 1, except that the wall 33c on the side of the package 33 from which the lead frames 12a to 12f do not protrude is formed in a constant thickness, and the thicker portion 33b is formed near the concave portion 15b corresponding to the portion where the lead frames 12a to 12f protrude, while the thinner portion 33a is formed in all other portions.

The same effect can be obtained with this light emitting device as with Example 1.

EXAMPLE 4

As shown in FIG. 4, the light emitting device 40 in this example is a light emitting device for mounting a single light emitting element, and two lead frames 42a and 42b are integrally fixed to a package 43.

Two cut-away concave portions 45a are formed in the outer surface of the package 43, and the lead frames 42a and 42b are accommodated in the concave portions 45a.

In and near the region where the light emitting element is mounted, the wall of the package 43 is formed as a thinner portion 43a, but a thicker portion 43b is formed in all other portions.

The thicker portion 43b and the thinner portion 43a vary at an angle of 146° (slope of 0.7).

This light emitting device can have enough mechanical strength while taking up the minimum amount of space, and can be easily mounted on a circuit board. Furthermore the space required for mounting on a circuit board can be kept to a minimum, which affords greater latitude in combining it with other electronic devices. In addition, other electronic devices can be disposed closer to the light emitting device, so the size and weight of a device can be reduced while the output is raised.

EXAMPLE 5

As shown in FIG. 5, the light emitting device 50 in this example is a light emitting device for mounting a single light emitting element, and two lead frames 52a and 52b are integrally fixed to a package 53.

Two cut-away concave portions 55a are formed in the outer surface of the package 53, and the lead frames 52a and 52b are accommodated in the concave portions 55a.

A thicker portion 53a is formed in the wall of the package 53 in the portion of the outer peripheral region of the region where the light emitting element is mounted, and a thinner portion 53b is formed in all other portions.

The thicker portion 53b and the thinner portion 53a vary at an angle of 135° (slope of 1).

This light emitting device can have enough mechanical strength while taking up the minimum amount of space, and can be easily mounted on a circuit board. Furthermore the space required for mounting on a circuit board can be kept to a minimum, which affords greater latitude in combining it with other electronic devices. In addition, other electronic devices can be disposed closer to the light emitting device, so the size and weight of a device can be reduced while the output is raised.

EXAMPLE 6

As shown in FIGS. 6a to 6d, the light emitting device 60 in this example is constituted substantially the same as the light emitting device in Example 1, except that the wall 63c on the side of the package 63 from which the lead frames 62a to 62d do not protrude is formed in a constant thickness, and the thicker portion 63b is formed near the concave portion 15b corresponding to the portion where the lead frames 62a to 62d protrude, while the thinner portion 63a is formed in all other portions.

The light emitting device 60 in this example is a light emitting device that emits white light, in which three blue light emitting elements are mounted in the lead frames 62a, 62b, and 62d, and a resin containing a fluorescent material is sealed inside the opening 14.

Figure 6A:
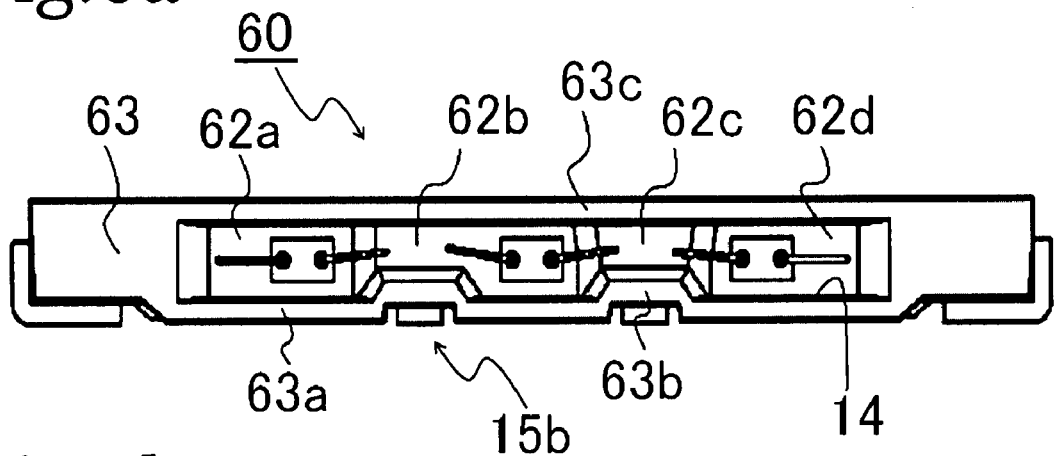
FIG. 6a is a simplified front view, FIG. 6b a simplified rear view, FIG. 6c a simplified plan view, and FIG. 6d an oblique view, of the main components in yet another light emitting device of the present invention.

Also, as shown in FIG. 6a, of the plurality of lead frames, the lead frames 62b and 62c that are not sandwiched at the ends of the package 63 are such that the portion sandwiched and held by the package 63 is wider than the thicker portion 63b, so the lead frames 62b and 62c and the package 63 are securely fixed, and the lead frames 62b and 62c do not readily come out of the package 63. In other words, when the portion sandwiched and held by the package 63 is thin (or, put another way, when the wall is thin), there is the possibility that the lead frames 62b and 62c will not be held down by the package 63, so the lead frames 62b and 62c may come out. With this light emitting device, however, this can be avoided.

Figure 6B:
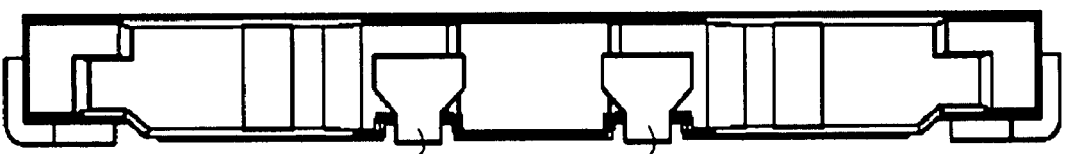

Furthermore, as shown in FIG. 6b, the lead frames 62b and 62c, which protrude outward from the package 63, are formed by bending on the exterior of the package 63, and serve as external terminals, are preferably such that their ends are larger than the bent portions protruding from the wall of the package 63 (such as, the ends having a home-plate shape or a trowel shape). This increases the surface area of the external terminals and improves heat dissipation. It is also advantageous because it makes bending easier because it is easier to apply force to the thick portion of the ends.

Figure 6C:
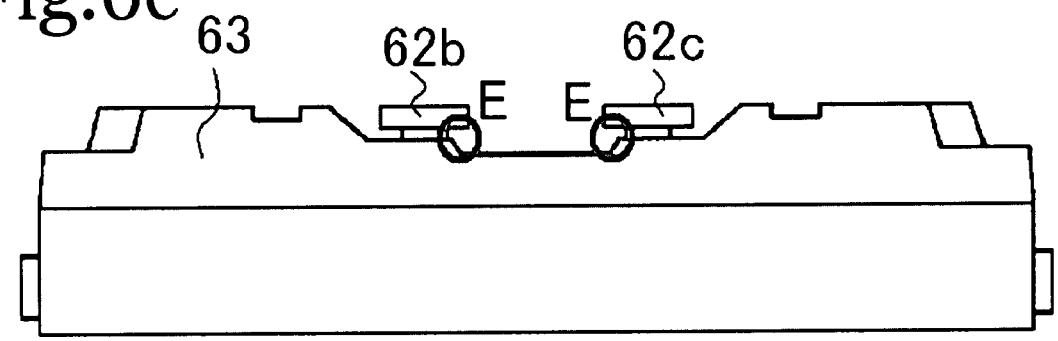
Figure 6D:
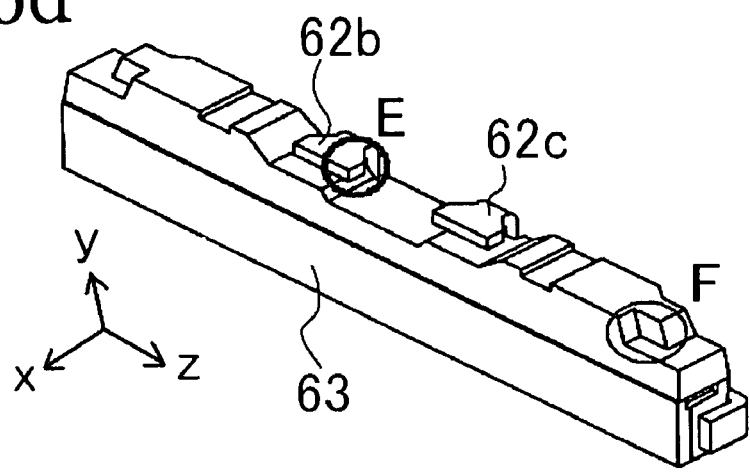

Also, as shown in FIG. 6c, in the bending of the lead frames 62b and 62c, it is preferable to leave a gap between the lead frames 62b and 62c and the concave portion on the back side of the package 63 (where there is a gate mark, indicated by "E" in FIGS. 6c and 6d). This ensures a better heat dissipation path and allows air cooling to proceed more efficiently. Furthermore, if a heat dissipating member protrudes from the package 63 and is connected up to the bent portion, heat can also escape from this member.

As shown in FIG. 6d, positioning in three directions (XYZ) can be accomplished by using a concave portion (F in FIG. 6d) formed by cutting away part of the package 63 in the XYZ directions, or the convex portion next to it. For example, in mounting this light emitting device on a mounting board or the like, precise positioning with a light guide or a mounting board or the like is easier, and more secure fixing to the light guide is possible.

The same effect can be obtained with this light emitting device as with Example 1.

The light emitting device of the present invention can be utilized as a surface mount type of light emitting device, of the type in which light is emitted from a side face toward a side face of the package, by mounting a light emitting diode chip, for example, and can be used not only in illumination devices used in image readers such as facsimile machines, copiers, and hand scanners, but also in various other illumination devices such as illumination light sources, backlight light sources for LED displays, portable telephones, and so forth, signaling devices, lighting switches, automotive brake lamps, various kinds of sensor, various kinds of indicator, and so on.

This application claims priority to Japanese Patent Application Nos. 2006-118360 and 2006-205499. The entire disclosure of Japanese Patent Application Nos. 2006-118360 and 2006-205499 are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A light emitting device comprising:
   a light emitting element;
   a plurality of lead frames to which the light emitting element is electrically connected; and
   a package coupled to said lead frames so that at least part of said lead frames is disposed in an interior of the package and at least one end of said lead frames protrudes outward from the package, the package containing the light emitting element therein and forming an opening for taking light from the light emitting element, the package extending in the lengthwise direction,
   the package including a concave portion formed in an outer wall surface of at least part of the package so that the lead frames protruding outward from the package are accommodated in the concave portion, the package including at least a pair of wall sections facing each other in the widthwise direction of the package to form said opening, each of the wall sections including at least a first wall surface disposed adjacent to the light emitting element, a second wall surface that is offset from the first wall surface in the widthwise direction and in the lengthwise direction of the package, and a third wall surface that links the first wall surface and the second wall surface so that portions of the wall section corresponding to the second wall surface and the third wall surface are formed thicker than a portion of the wall section corresponding to the first wall surface.

2. The light emitting device according to claim 1, wherein the first wall surface, the second wall surface, and the third wall surface each have a different taper angle.

3. The light emitting device according to claim 1, wherein the first wall surface, the second wall surface, and the third wall surface are set to a taper angle of 0 to 45°.

4. The light emitting device according to claim 1, wherein the third wall surface is linked to the first wall surface or second wall surface at an angle of 90° to 170°.

5. The light emitting device according to claim 1, wherein the lead frames protruding outward from the package are accommodated such that part of the surface of the lead frames protruding outward from the package is in the same plane as the outer wall surface of the package.

6. The light emitting device according to claim 1, wherein the thick part of the wall section is at least part of the wall constituting the concave portion.

7. The light emitting device according to claim 1, wherein the thick part of the wall section is tapered.

8. The light emitting device according to claim 7, wherein the thick part of the wall section is formed thick by a different taper angle from that of other parts.

9. The light emitting device according to claim 1, wherein a plurality of light emitting elements are mounted to the package.

10. The light emitting device according to claim 9, wherein the plurality of light emitting elements are elements that emit light of different colors.

* * * * *